United States Patent
Lu et al.

(10) Patent No.: US 9,305,866 B2
(45) Date of Patent: Apr. 5, 2016

(54) INTERMETALLIC COMPOUND FILLED VIAS

(71) Applicant: International Business Machines Corporation, Armonk, NY (US)

(72) Inventors: Minhua Lu, Mohegan Lake, NY (US); Jae-Woong Nah, Closter, NJ (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 4 days.

(21) Appl. No.: 14/189,389

(22) Filed: Feb. 25, 2014

(65) Prior Publication Data

US 2015/0243584 A1    Aug. 27, 2015

(51) Int. Cl.
| | |
|---|---|
| *H01L 21/44* | (2006.01) |
| *H01L 23/48* | (2006.01) |
| *H01L 21/768* | (2006.01) |
| *H01L 23/00* | (2006.01) |
| *H01L 23/498* | (2006.01) |
| *H01L 21/48* | (2006.01) |

(52) U.S. Cl.
CPC ............ *H01L 23/481* (2013.01); *H01L 21/486* (2013.01); *H01L 21/76879* (2013.01); *H01L 21/76883* (2013.01); *H01L 21/76898* (2013.01); *H01L 23/49827* (2013.01); *H01L 24/81* (2013.01); *H01L 2224/81815* (2013.01); *H01L 2924/0105* (2013.01); *H01L 2924/01028* (2013.01); *H01L 2924/01029* (2013.01); *H01L 2924/01049* (2013.01); *H01L 2924/01327* (2013.01); *H01L 2924/2064* (2013.01)

(58) Field of Classification Search
CPC ................... H01L 21/76898; H01L 21/76879
USPC ........................................................ 438/612
See application file for complete search history.

(56) References Cited

U.S. PATENT DOCUMENTS

| | | | |
|---|---|---|---|
| 5,133,120 A | 7/1992 | Kawakami | |
| 6,452,117 B2 * | 9/2002 | Curcio et al. | 174/262 |
| 7,497,366 B2 | 3/2009 | Chey | |
| 7,681,779 B2 | 3/2010 | Yang | |
| 8,377,565 B2 | 2/2013 | Sekine | |
| 8,388,724 B2 | 3/2013 | Kato | |
| 8,415,784 B2 | 4/2013 | Sekine | |
| 2010/0244268 A1 * | 9/2010 | Tang et al. | 257/773 |
| 2012/0247822 A1 * | 10/2012 | Fuller et al. | 174/260 |
| 2013/0008698 A1 | 1/2013 | Himori | |

(Continued)

FOREIGN PATENT DOCUMENTS

JP    2004228135    8/2004

OTHER PUBLICATIONS

Blaine Partee Intermetallics in Electronic Soldering ACI Technologies, National Electronics Manufacturing Center of Excellence, Jun. 2004.*

Yong-Sung Eom et al., "Characterization of a Hybrid Cu Paste as an Isotropic Conductive Adhesive". ETRI Journal, vol. 33, No. 6, Dec. 2011, pp. 864-870.

(Continued)

*Primary Examiner* — David S Blum
(74) *Attorney, Agent, or Firm* — Louis J. Percello; Otterstedt, Ellenbogen & Kammer, LLP

(57) ABSTRACT

Electronic devices including intermetallic columns within vias are provided. Vias are filled with one or more pastes containing metal particles. Thermal treatment of the pastes within the vias converts the particles within the pastes to one or more intermetallic compounds that do not melt during next level packaging.

12 Claims, 3 Drawing Sheets

(56) References Cited

U.S. PATENT DOCUMENTS

| | | |
|---|---|---|
| 2013/0068513 A1 | 3/2013 | Hirai |
| 2013/0075930 A1 | 3/2013 | Sekine |
| 2013/0118573 A1 | 5/2013 | Adachi |
| 2013/0136645 A1 | 5/2013 | Sekine |
| 2014/0233199 A1* | 8/2014 | Munakata et al. ............ 361/761 |

OTHER PUBLICATIONS

Manabu Yoshida et al., "Novel low temperature sintering type Cu type Cu alloy pastes for silicon solar cells". Advanced Industrial Science and Technology, 3rd Workshop on Metallization for Crystalline Silicon Solar Cells, Oct. 24-26, 2011.

* cited by examiner

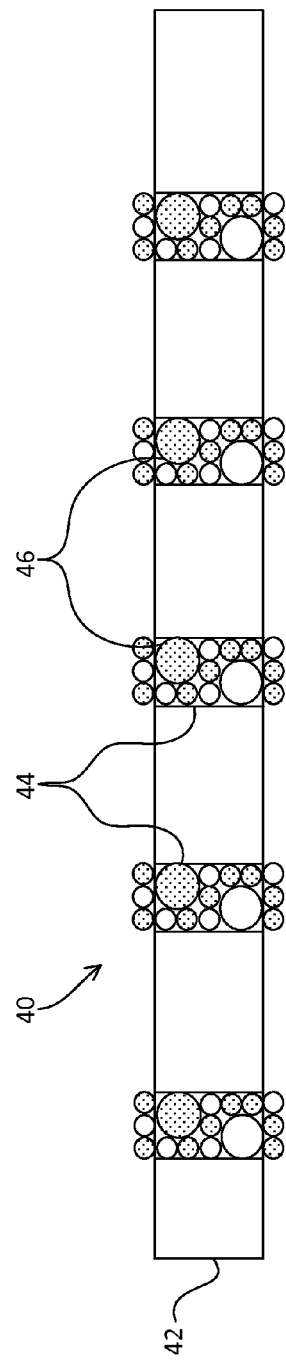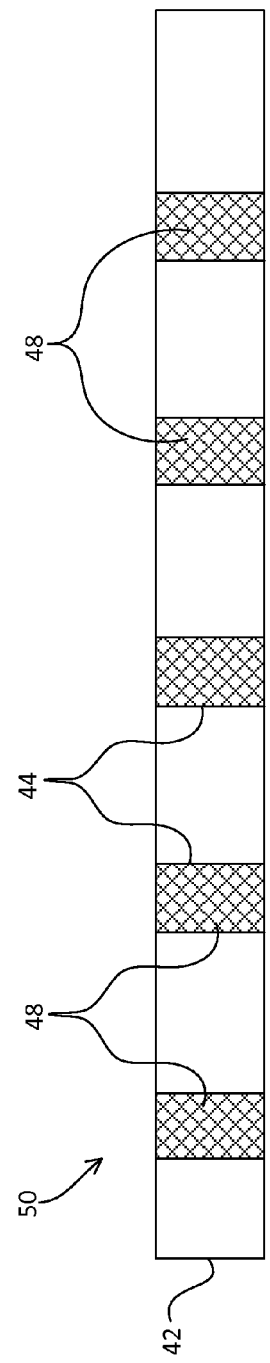
FIG. 2A
FIG. 2B

INTERMETALLIC COMPOUND FILLED VIAS

FIELD

The present disclosure relates to the physical sciences and, more particularly, to electronic structures including vias containing electrical conductors for creating electrical connections and methods of fabrication thereof.

BACKGROUND

Three dimensional (3D) packaging is employed in the microelectronics industry for stacking integrated circuits and thereby conserving space, increasing bandwidth, and reducing latency to boost the performance of silicon chips. In some 3D packages, through-silicon vias provide a means for forming electrical connections between circuits. Interposers containing vias are used between chips in some applications.

Via conductors are employed in electronic device packages to provide electrical connections between stacked dies or chips and/or other elements such as interposers. Vias are formed through substrates such as silicon wafers and filled with electrically conductive materials. Deep reactive ion etching ((DRIE) is a technique for forming high aspect ratio (relatively high depth to diameter) holes in silicon wafers. The via diameter ranges from 2-100 µm, with ranges of 5-50 µm being commonly employed. The via depth is from 10-500 µm, with ranges 30-300 µm being used in a number of applications. The aspect ratio is 3-30. Electroplating is one technique that is sometimes employed to form electrical conductors within vias. Pulsed plating, special plating solution and special tools are employed to ensure plating quality in high aspect ratio vias. Copper is among the materials electroplated to form via conductors in some applications. Vias can also be filled with solder or copper paste to form electrical conductors, though the current carry capability of conductors formed using solder or copper paste may be relatively limited. Copper paste includes copper particles and polymeric resin. The relatively small point contact areas among the copper particles limit the current carry capability thereof. Solder paste consists of solder powder (e.g. tin particles) and flux, resulting in volume shrinkage during reflow that should be addressed. The use of solder or copper paste within high aspect ratio vias entails the need to fill the vias with minimum resin and without voids.

SUMMARY

A method provided in accordance with the principles described herein includes obtaining a structure including a wafer having top and bottom surfaces and a plurality of vias extending within the wafer, and injecting the vias with a paste containing a mixture of first particles comprising at least one of tin and indium and second particles of a metal capable of forming one or more intermetallic compounds with the first particles. The method further includes, within the vias, thermally converting the first particles and the second particles within the paste into a plurality of electrically conductive columns consisting essentially of one or more intermetallic compounds.

An electronic device provided in accordance with the principles described herein includes a wafer, a plurality of vias within the wafer, and a plurality of electrically conductive columns filling the vias, each of the columns consisting essentially of one or more intermetallic compounds, the intermetallic compounds comprising at least one of tin and indium.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

Wafers, interposers and fabrication methods as disclosed herein can provide substantial beneficial technical effects. For example, one or more embodiments may provide one or more of the following advantages:

Relatively large via contact areas;
Reduced porosity compared to paste-filled vias;
Good current carry capability;
Facilitates filling of vias with intermetallic electrical conductors;
Intermetallic via conductors remain solid during subsequent packaging processes;
Facilitates filling of high aspect ratio vias;
Relatively low cost and high reliability;
Low temperature processing comparable to plating and solder paste printing;
Low chemical waste compared to plating.

These and other features and advantages will become apparent from the following detailed description of illustrative embodiments thereof, which is to be read in connection with the accompanying drawings.

BRIEF DESCRIPTION OF THE DRAWINGS

FIG. 2A shows a schematic illustration of a substrate having vias filled with a mixture of tin and copper or nickel pastes;

FIG. 2B shows a schematic illustration of the substrate following conversion of the pastes into an intermetallic compound.

DETAILED DESCRIPTION

Methods are disclosed herein for filling blind and through vias with electrically conductive materials. In some embodiments, the vias are filled with mixtures of tin pastes and copper or nickel pastes and the tin and copper or nickel pastes are converted into intermetallic compound(s) (IMC) by thermal treatment. In some embodiments, two pastes are mixed before filling the vias to form a single paste containing, for example, a desired ratio of tin and copper particles. In other embodiments, a single paste containing a desired ratio of metal particles (e.g. tin and copper) blended within the paste can be used to fill the vias without the need for mixing two different pastes. The intermetallic columns formed in the vias will have much larger contact areas than copper pastes and better current capacity than solder. Moreover, intermetallic compounds, having much higher melting points than solder materials, do not melt during subsequent processing steps.

Such processing steps may include the bonding of wafers, chips and/or interposers using solder bump (e.g. C4) connections. The columns formed within the vias by intermetallic compounds further provide good reliability with respect to temperature variations and mechanical impacts on electronic devices incorporating such columns.

Figure 1:
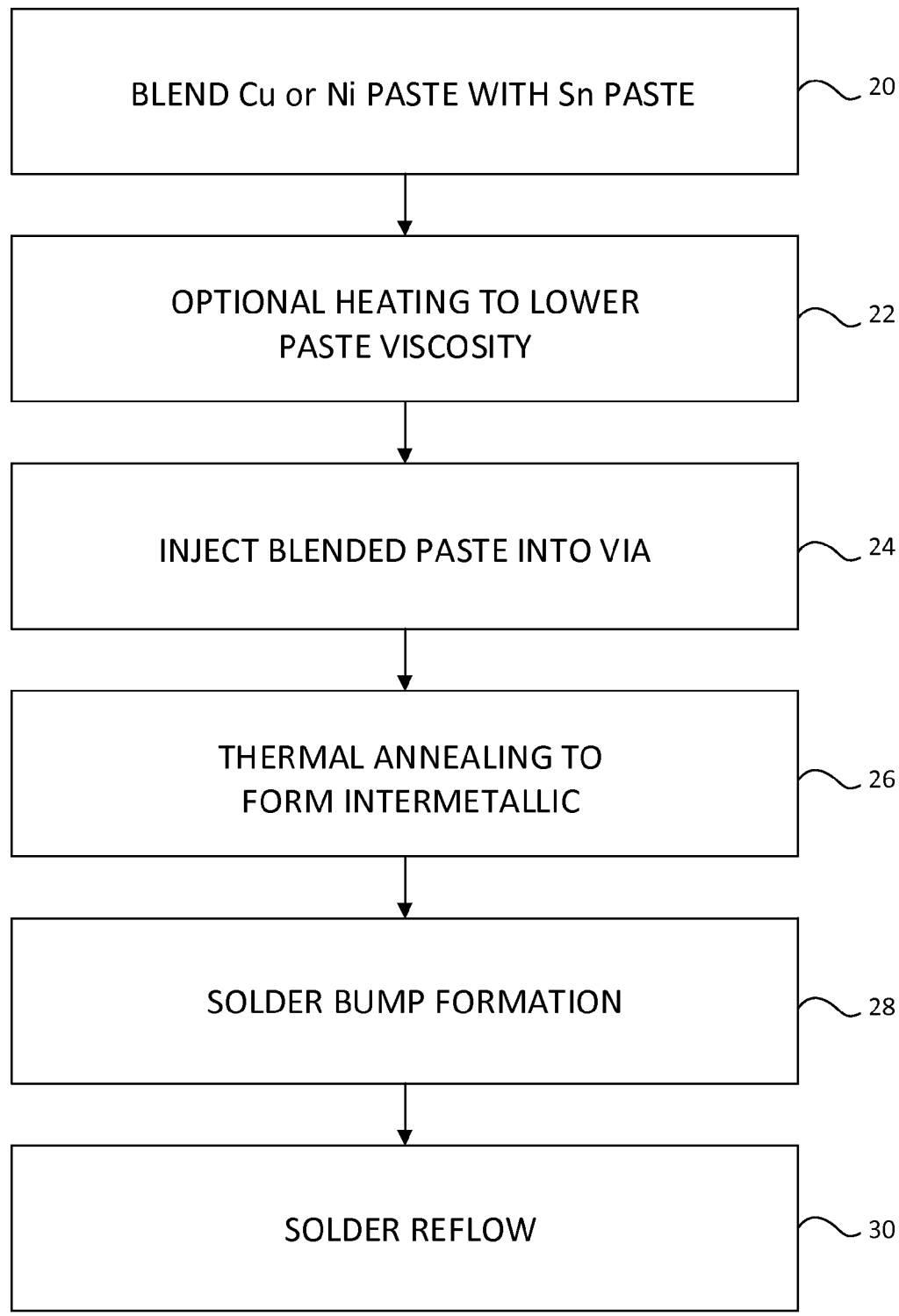
FIG. 1 shows a flow diagram of an exemplary fabrication process.

A flowchart showing exemplary fabrication steps is provided in FIG. 1. A copper-containing paste or a nickel-containing paste is obtained for mixture with a tin-containing paste. Electrically conductive pastes such as copper paste and nickel paste are commercially available for electronic applications. Some pastes contain metal (e.g. copper or nickel) particles or flakes within resin binders and/or other materials or solvents. In one exemplary embodiment, copper paste is mixed with tin paste in a blending step 20. A desired ratio of the two pastes is thoroughly blended. In an exemplary embodiment wherein copper paste is mixed with tin paste, the ratio is chosen to obtain the maximum conversion of the copper and tin within the pastes to a $Cu_6Sn_5$ intermetallic compound following a subsequent annealing step described further below. In exemplary embodiments wherein nickel paste is mixed with tin paste, the ratio is selected to obtain maximum conversion of the tin and nickel particles to $Ni_3Sn_4$. The ratio of the particular pastes, including the metal loadings thereof. The blended pastes are optionally heated during and/or following the blending step to obtain the desired viscosity for blending and/or paste injection. The optional heating step 22 is followed by injection of the blended pastes into the vias of a substrate such as a silicon or glass wafer, a ceramic substrate, or other substrate in which electrical connections are to be formed within vias. The step 24 of via injection is further facilitated in some embodiments by using pressure and/or vacuum as discussed further below. An exemplary structure 40 as schematically shown in FIG. 2A is obtained in some embodiments. The structure includes the substrate 42 containing an array of vias 44 and a mixture of pastes forming columns 46 within the vias 44. The vias may be overfilled with paste mixture, as shown in FIG. 2A, to compensate for possible volume shrinkage during further processing. As further shown in FIG. 2A, the particles of different metals (e.g. tin and copper) are sufficiently mixed within the vias to allow the formation of intermetallic electrical conductors from the mixed particles within the vias. The resulting electrical conductors will accordingly consist essentially of intermetallic compound(s). (Particles comprising one type of metal are hatched in FIGS. 2A and 3 while particles comprising a second type of metal are unhatched.) While the substrate 42 is shown as including through vias, it will be appreciated that the principles described herein are applicable to forming electrical conductors within blind vias. The mixed pastes within the vias are subjected to a thermal annealing step 26, forming one or more intermetallic compounds within the vias. The intermetallic compound(s) forms an intermetallic column 48 extending through each via in one or more embodiments. In other words, the column 48 consists essentially of one or more intermetallic compounds instead of a mixture metal particles and provides substantially uniform electrical conductivity throughout its length. Each column 48 may comprise more than one type of intermetallic compound. In embodiments wherein the injected paste mixture contains only copper and tin particles $Cu_6Sn_5$ is the dominant IMC phase though other IMC phases consisting of copper and tin may also be formed. $Ni_3Sn_4$ is the dominant phase of intermetallic columns formed from paste(s) containing only nickel and tin particles, though other nickel-tin IMC phases are also possible. Other metals, including but not limited to Ag, Au, Zn, Bi, Fe, Co, Al, Mn, W and In can be included in the paste(s) and can form intermetallic compounds with tin. Exemplary intermetallic compounds comprising tin include AuSn, InSn, AgSn, TiSn, ZnSn, AlSn, CeSn and CsSn. Indium may, instead of tin, function as a base for lead-free solder and form intermetallic compounds with many metals. The vias are accordingly capable of carrying relatively high current as the intermetallic columns 48 do not rely on contacts between metal particles within the vias. FIG. 2B shows an exemplary structure 50 obtained following the thermal annealing step 26. The vias 44 within the substrate 42 contain electrically conductive intermetallic columns 48 formed from the mixed pastes. The via diameters range from 2-100 µm, with ranges of 5-50 µm being employed in one or more exemplary embodiments. The via depth is from 10-500 µm, with ranges 30-300 µm being used in one or more exemplary embodiments. The aspect ratio is 3-30, preferably 5-20.

Solder bumps have been widely used to connect chips, wafers and/or interposers and form 3-D stacked devices. Solder bumps are sometimes deposited on contact pads on chip surfaces and the chips are then flipped and positioned such that the solder bumps are aligned with matching pads of an external circuit. Solder reflow completes the interconnection process, after which underfill material is introduced to fill the spaces about the interconnections. Solder bumps can be formed in step 28 on the structure 50 shown in FIG. 2B and/or on another structure (not shown) to be stacked on the structure 50. Solder bump formation is well known to the art. A solder reflow step 30 allows the electrical connection of the structure 50 to another structure such as a chip or wafer. The structure 50 is an interposer wafer in some embodiments. The intermetallic columns 48 do not melt at temperatures associated with conventional solder reflow.

Figure 3:
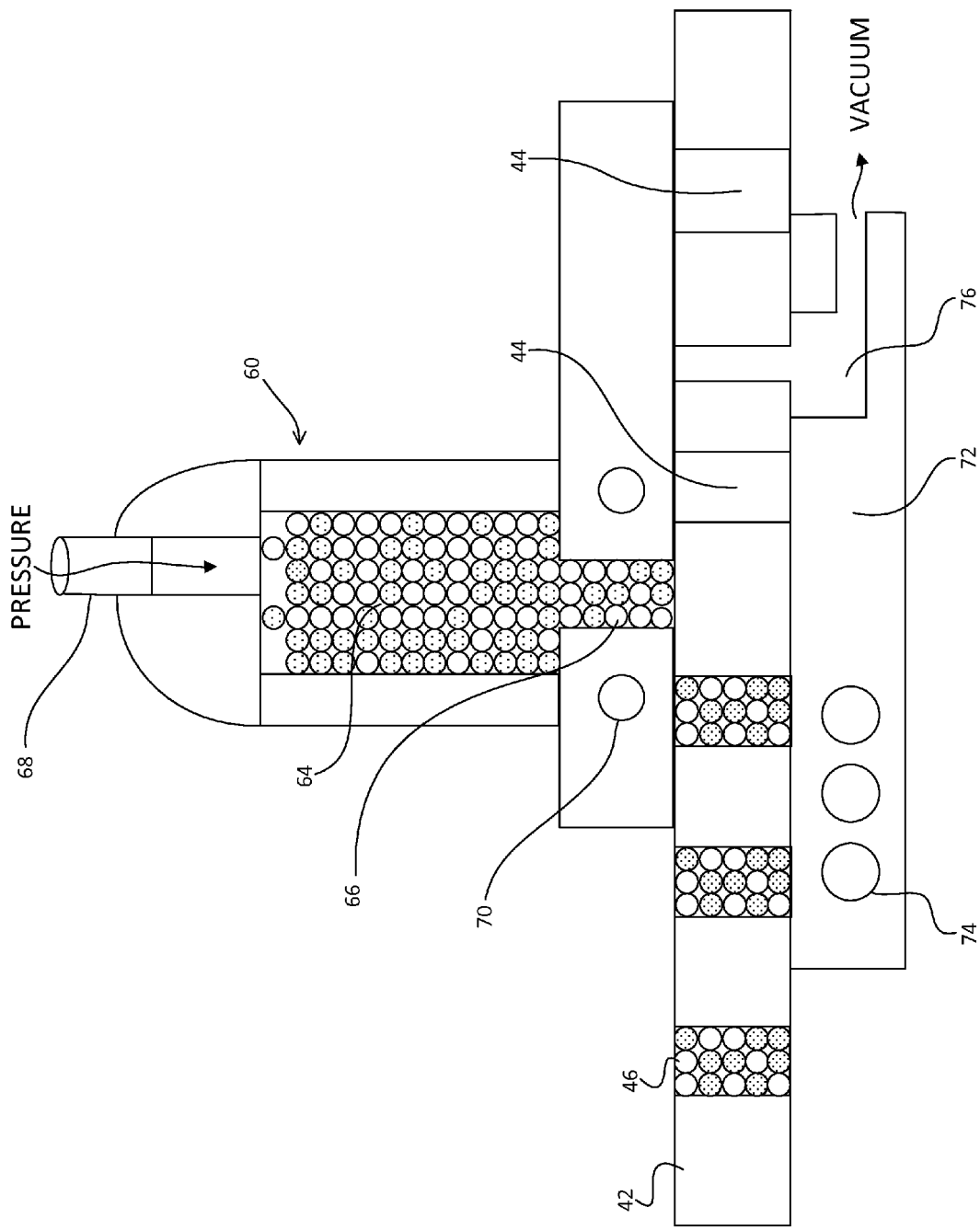
FIG. 3 is a schematic illustration of an apparatus for evacuating high aspect ratio vias and filling the vias with a mixture of tin paste and copper or nickel paste.

FIG. 3 schematically illustrates an apparatus 60 for injecting a mixture of pastes, such as tin and copper pastes, into vias 44 extending through a substrate 42. The apparatus 60 includes a housing 62 having a chamber for containing a mixture 64 of pastes or a single paste containing a mixture of metal particles. An outlet 66 allows the contents of the chamber to be injected into the vias 44 of the substrate 42. The body of the housing 62 includes a planar bottom surface that is configured to provide a seal against the top surface of the substrate 42. An inlet 68 allows pressurized air to be introduced into the chamber and force the paste mixture 64 towards the outlet 66. The apparatus includes an optional heater 70 for heating the paste mixture 64, thereby decreasing its viscosity if necessary or desirable, just prior to its injection into the vias 44. In embodiments wherein the vias are through vias, such as shown in FIG. 3, a fixture 72 is provided that has a top surface in opposing relation to the bottom surface of the housing 62. The substrate 42 is positioned between the housing and fixture 72. The fixture includes an optional heater 74. The heater 74 facilitates curing of the injected paste mixture. The fixture 72 further includes a channel 76 to which a vacuum source (not shown) can be connected. The channel 76 includes an opening within the top surface of the fixture for evacuating air from the vias 44. Sealing contact is maintained between the fixture 72 and the substrate 42 as well as between the housing 62 and the substrate so that the vias remain evacuated until injected with paste mixture 64. A mechanism (not shown) for moving the substrate 42 with respect to the housing and fixture is provided in some embodiments. Alternatively, mechanism(s) (not shown) are provided for moving the housing and fixture relative to the substrate.

In operation, the chamber within the housing 62 is filled with a blended mixture of paste containing at least two types metal particles, one of which contains tin. In some exemplary embodiments, two pastes are included in the mixture, one containing tin and the other containing copper. Heat may be applied to facilitate blending the pastes prior to introducing them into the chamber. The substrate is positioned between the housing and fixture 72. The space between the housing and fixture is vertically adjusted to form seals between the top and bottom surfaces of the substrate and the bottom and top surfaces of the housing and fixture, respectively. The vacuum source (not shown) causes air to be evacuated from the vias 44 within the substrate as the vias pass over the channel opening in the top surface of the fixture. Vacuum levels in some embodiments are between 0.01 and 0.1 MPa (megapascals) A vacuum pressure range of 0.01-0.05 MPa is preferred in some embodiments. The vias are sealed between the housing and fixture subsequent to evacuation. Relative translational movement between the substrate 42 and the housing 62 causes the vias to move beyond the channel opening in the fixture and pass beneath the chamber outlet 66. The vacuum maintained within the vias facilitates filling the vias 44. Pressure exerted on the paste mixture 64 in the chamber causes the mixture to be injected into the vias. Possible heating of the paste mixture 64 lowers mixture viscosity, further facilitating its injection into the vias. One or more of the heaters 70, 74 may be employed to heat the paste mixture during and/or subsequent to injection. The resin and/or flux contained within the paste mixture 64 is cured subsequent to injection as it is heated by the heater 74 in the fixture. Such curing ensures that the paste mixture forming each column 46 adheres to the substrate and remains in the vias 44 once contact with the fixture 72 is no longer maintained. Thermal annealing of the columns 46 causes the metals contained therein to form intermetallic columns 48 as shown in FIG. 2B.

The thermal annealing process employed to form intermetallic columns 48 in some embodiments using tin paste includes maintaining a paste mixture column 46 temperature of about 130-270° C. for about 30-300 seconds, preferable 250-260 for about thirty to sixty seconds. A controlled thermal annealing process that causes intermetallic formation from the center portion of the via towards the surface portions thereof is utilized to minimize voids due to possible volume shrinkage. Such controlled thermal annealing can be performed in various ways. One exemplary process includes heating the substrate 42 to a temperature sufficient to cause melting of tin or tin alloy particles contained within a paste mixture while maintaining the ambient temperature just below the melting point thereof. Melting of the tin (or in some embodiments tin alloy) particles accordingly occurs inside the vias 44 while the surfaces of the columns 46 remain solid. In embodiments wherein the paste contains copper particles, melted tin reacts with nearby copper particles for form an intermetallic compound, predominantly $Cu_6Sn_5$. The melting points of metals such as copper and nickel are substantially higher than the temperature ranges employed for the thermal annealing process used herein to form intermetallic compounds. The ambient temperature is then raised above the melting point to cause melting of the tin (or tin alloy) particles at the surface portions of the columns 46. Melted tin (or indium) reacts with metal particles within the paste, such as copper or nickel particles, to form intermetallic compounds. The substrate is cooled while maintaining the ambient temperature at or above the temperature in which the surface portions of the columns melt. This causes the portions of the columns 46 within the vias 44 to solidify first. After full conversion to an intermetallic compound, the ambient temperature is gradually reduced to the substrate temperature. The entire structure (e.g. structure 50 shown in FIG. 2B) is then cooled to room temperature. Conduction heating and cooling may be employed with respect to substrates amenable to heat transfer via conduction to form the intermetallic columns 48 within the vias 44. The formation of voids due to possible volume shrinkage within the vias is reduced by such a controlled annealing process.

The injection of blended solder pastes or a single paste containing a mixture of metal particles into blind vias or cavities (not shown) formed in a wafer is conducted in accordance with one or more embodiments. Such injection is facilitated through the use of a high pressure injection apparatus assisted by vacuum and possibly heat. The injection apparatus 60 described above with respect to FIG. 3 can be employed to fill blind vias in wafers with paste mixtures 64 amenable to the formation of intermetallic compositions through subsequent thermal annealing. The injection apparatus 60 is positioned in a vacuum chamber (not shown) having a vacuum pump connected thereto. U.S. Pat. No. 7,497,366, which is incorporated by reference herein, discloses an injection system including a vacuum chamber for removing air from cavities within a mold. Blind vias filled with paste mixtures in a vacuum chamber can be heated as described above with respect to FIG. 3 to facilitate curing of resin(s) contained within the paste mixtures. It will be appreciated that the techniques disclosed herein are applicable to wafers of various shapes and sizes.

The methods described above include the use of a tin-containing paste or an indium-containing paste. A paste containing pure tin is employed in some embodiments. A paste containing tin alloy particles with flux is employed in one or more embodiments. Exemplary tin alloys include tin solder alloys such as SnCu, SnAg and SnAgCu. The metal loading in the tin or tin alloy pastes, in embodiments where such pastes are employed, is preferably fifty to eighty percent (50-80%). The flux is preferably a no-clean flux. The particle size of the tin-containing paste may range from sub-micron levels to pastes containing a five to fifteen micron (5-15 μm) particle size range. As discussed above, the tin-containing paste is blended with a copper paste or a nickel paste prior to injection within the vias. The tin-containing paste is mixed with a copper paste in some embodiments and a nickel paste in other embodiments. Copper pastes contain substantially pure copper particles while nickel pastes contain substantially pure nickel particles. Metal particle size ranges from forty nanometers (40 nm) to about three microns (3 μm) in exemplary embodiments. The copper or nickel paste has a metal loading ranging between twelve and ninety percent (12-90%) and contains an ethylene glycol solvent in one or more exemplary embodiments. As discussed above, the ratio of tin-containing paste to copper or nickel-containing paste depends on the metal loading in each. In an exemplary embodiment wherein a tin paste is mixed with a copper paste, the ratio is selected such that conversion of the mixture to $Cu_6Sn_5$ is maximized, resulting in columns that are substantially single phase $Cu_6Sn_5$ throughout the vias. In embodiments where tin paste is mixed with nickel paste or tin particles are mixed with nickel particles in a single paste, the ratio is chosen to maximize formation of columns consisting predominantly of $Ni_3Sn_4$.

Given the discussion thus far and with reference to the exemplary embodiments discussed above and the drawings, it will be appreciated that, in general terms, an exemplary electronic device is provided that includes a wafer 42, a plurality of vias 44 within the wafer, and a plurality of electrically conductive columns 48 filling the vias. Each of the columns consists essentially of one or more intermetallic compounds, the intermetallic compounds comprising at least one of tin and indium. At least one of copper and nickel is further employed in some embodiments. FIG. 2B shows an exemplary device 50. In one or more embodiments, the columns consist essentially of $Cu_6Sn_5$. The wafer comprises silicon or glass and the vias have aspect ratios between three and thirty in some embodiments. Each column 48 has a diameter between 2-100 μm. in some embodiments. The columns consist essentially of $Ni_3Sn_4$ in one or more embodiments.

An exemplary method includes obtaining a structure including a wafer having top and bottom surfaces and a plurality of vias 44 extending within the wafer. The vias are preferably evacuated and then injected with a paste containing a mixture of first particles of a first metal and second particles of a second metal. Vacuum facilitates paste injection. The second metal has a melting point substantially higher than the melting point of tin in one or more embodiments. In other embodiments, such as where the first and second metals are tin and indium, respectively, the second metal melts at a temperature lower than that of tin. Copper and nickel, for example, have melting points that greatly exceed the melting point of tin. Within the vias, the step of thermally converting the first particles and the second particles within the paste into a plurality of electrically conductive columns consisting essentially of one or more intermetallic compounds is conducted. In some embodiments, the first particles comprise tin and the second particles are copper particles, wherein the first particles comprising tin and the copper particles within the paste are converted into $Cu_6Sn_5$. The particles comprising tin and the copper particles are mixed in a selected ratio within the paste such that the plurality of electrically conductive columns 48 each consists essentially of $Cu_6Sn_5$. In one or more embodiments, such as shown in FIG. 3, the vias extend through the wafer and adjoin the top and bottom surfaces, and the step of evacuating the vias further includes applying vacuum pressure from the bottom surface of the wafer 42 to facilitate injecting the paste into the vias 44 from the top surface of the wafer. Further embodiments of the method include the step of providing an injection apparatus having a chamber and a chamber outlet 66 and filling the chamber with the paste. The step of injecting the vias 44 further includes applying pressure to the paste within the chamber and causing the paste to exit the chamber through the outlet. In some embodiments, the method further includes the step of curing the paste within the vias prior to the step of thermally converting. The step of thermally converting includes forming an intermetallic compound at an interior portion of each via 44 prior to forming an intermetallic compound from the particles within the vias at the top and bottom surfaces of the wafer in some embodiments. Steps including, in sequence, heating the wafer to a first temperature while maintaining ambient temperature below the first temperature, raising the ambient temperature, cooling the wafer, and lowering the ambient temperature may be performed to cause intermetallic formation first in the interior portions of the vias. The method may further include providing a substrate, at least one of the substrate and wafer including solder bumps, placing the substrate and wafer in adjoining relation to each other, and causing reflow of the solder bumps while the electrically conductive columns remain solid during reflow. The columns 48 remain solid at temperatures associated with lead-free solder reflow. In some embodiments, the paste contains nickel (Ni) particles. The particles comprising tin and the nickel particles within the paste are converted into $Ni_3Sn_4$ via thermal annealing as described above. The particles comprising tin and the nickel particles are mixed within the paste in a selected ratio such that the plurality of electrically conductive columns each consists essentially of $Ni_3Sn_4$.

Those skilled in the art will appreciate that the exemplary structures discussed above can be distributed in raw form or incorporated as parts of intermediate products or end products that benefit from 3D packaging technology.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below", "top" and "bottom" are used to indicate relative positioning of elements or structures to each other as opposed to relative elevation.

The corresponding structures, materials, acts, and equivalents of all means or step plus function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the various embodiments with various modifications as are suited to the particular use contemplated.

What is claimed is:

1. A method comprising:

obtaining a structure including a wafer having top and bottom surfaces and a plurality of vias extending within the wafer;

injecting the vias with a paste containing a mixture of first particles comprising at least one of tin and indium and second particles of a metal capable of forming one or more intermetallic compounds with the first particles, thereby forming paste mixture columns within the vias, the paste mixture columns including first portions within the vias and surface portions, and within the vias, thermally converting the first particles and the second particles within the paste mixture columns into a plurality of electrically conductive columns consisting essentially of one or more intermetallic compounds by sequentially:

melting the first particles within the first portions of the paste mixture columns while maintaining ambient temperature below the melting point of the first particles;

raising the ambient temperature above the melting point of the first particles to cause melting of the first particles in the surface portions of the paste mixture columns;

cooling the first portions of the paste mixture columns while maintaining the ambient temperature above the melting point of the first particles, thereby forming intermetallic first portions of the electrically conductive columns, and reducing the ambient temperature, thereby forming intermetallic surface portions of the electrically conductive columns.

2. The method of claim 1, wherein the first particles comprise tin and the second particles are copper particles, further including thermally converting the first particles comprising tin and the copper particles within the paste mixture columns into $Cu_6Sn_5$, the particles comprising tin and the copper particles being mixed in a selected ratio such that the plurality of electrically conductive columns each consists essentially of $Cu_6Sn_5$.

3. The method of claim 1, further including the step of evacuating the vias, thereby facilitating injecting the paste into the vias.

4. The method of claim 3, further including the step of providing an injection apparatus having a chamber and a chamber outlet, filling the chamber with the paste, and wherein the step of injecting the vias further includes applying pressure to the paste within the chamber and causing the paste to exit the chamber through the outlet.

5. The method of claim 4, further including the step of curing the paste within the vias prior to the step of thermally converting.

6. The method of claim 1, wherein the step of thermally converting further includes heating the wafer to cause the melting of the first particles within the first portions of the paste mixture columns.

7. The method of claim 1, further including providing a substrate, at least one of the substrate and wafer including solder bumps, placing the substrate and wafer in adjoining relation to each other, and causing reflow of the solder bumps while the electrically conductive columns remain solid during reflow.

8. The method of claim 1, wherein the paste contains tin particles and nickel particles, further including thermally converting the first and second particles within the paste mixture columns into $Ni_3Sn_4$, the particles comprising tin and the nickel particles being mixed in a selected ratio such that the plurality of electrically conductive columns each consists essentially of $Ni_3Sn_4$.

9. The method of claim 1, wherein the paste includes a tin-containing paste blended with one of a copper paste and a nickel paste, the tin-containing paste containing flux and having a metal loading of fifty to eighty percent, the one of the copper paste and nickel paste having a metal loading between twelve and ninety percent.

10. The method of claim 1, wherein the vias extend through the wafer, further including the step of applying vacuum pressure to the vias from the bottom surface of the wafer, thereby facilitating injecting the vias with the paste.

11. The method of claim 1, further including the step of mixing a first paste containing the first particles with a second paste containing the second particles, thereby obtaining the paste containing the mixture of first particles and second particles.

12. The method of claim 11, wherein the first paste includes one of pure tin and a tin solder alloy.

* * * * *